United States Patent [19]

Miller

[11] 4,257,004
[45] Mar. 17, 1981

[54] ELECTRICAL ENERGY MEASURING MULTIMETER

[75] Inventor: Robert C. Miller, Penn Hills Township, Allegheny County, Pa.

[73] Assignee: Westinghouse Electric Corp., Pittsburgh, Pa.

[21] Appl. No.: 972,164

[22] Filed: Dec. 21, 1978

[51] Int. Cl.³ ............................................. G01R 7/00
[52] U.S. Cl. .................................... 324/141; 324/142
[58] Field of Search ................. 324/141, 142; 364/483

[56] References Cited

U.S. PATENT DOCUMENTS

| | | | |
|---|---|---|---|
| 4,056,774 | 11/1977 | Shum | 324/142 |
| 4,182,983 | 1/1980 | Heinrich et al. | 324/142 |

Primary Examiner—Stanley T. Krawczewicz
Attorney, Agent, or Firm—E. L. Pencoske

[57] ABSTRACT

An electrical energy measuring multimeter for measuring electrical energy consumption is disclosed. The multimeter utilizes a first input signal that is proportional to the time derivative of a current delivered to a load. The first input signal is converted to a train of pulse signals. A second input signal that is proportional to a voltage delivered to the load is compared to a periodic reference signal. This comparison produces a gate command signal which controls a switch. The switch selectively connects the train of pulse signals to a totalizer. The sum of pulses in the totalizer is related to the time integral of the product of the current and voltage delivered to the load.

18 Claims, 6 Drawing Figures

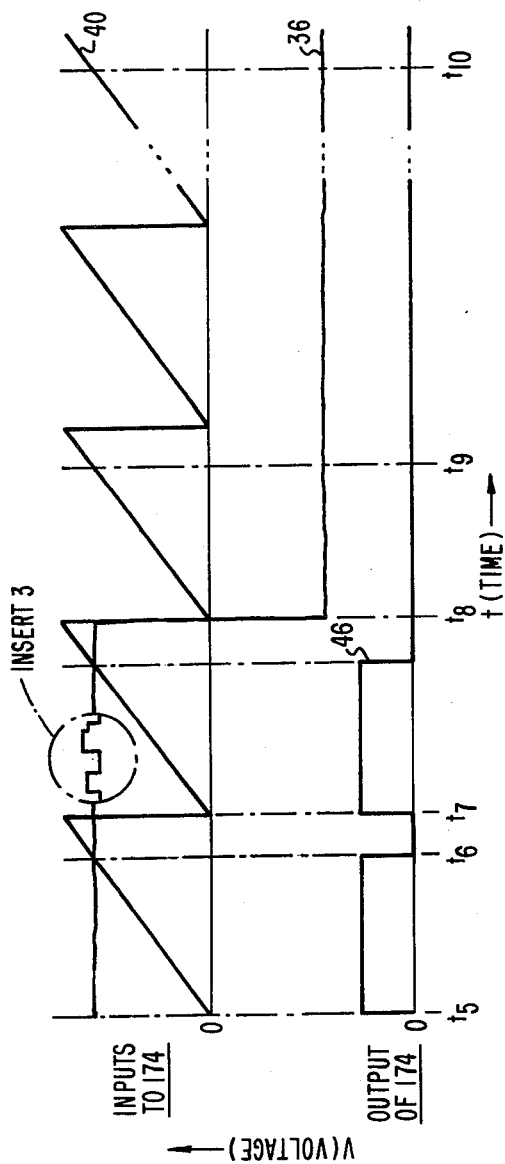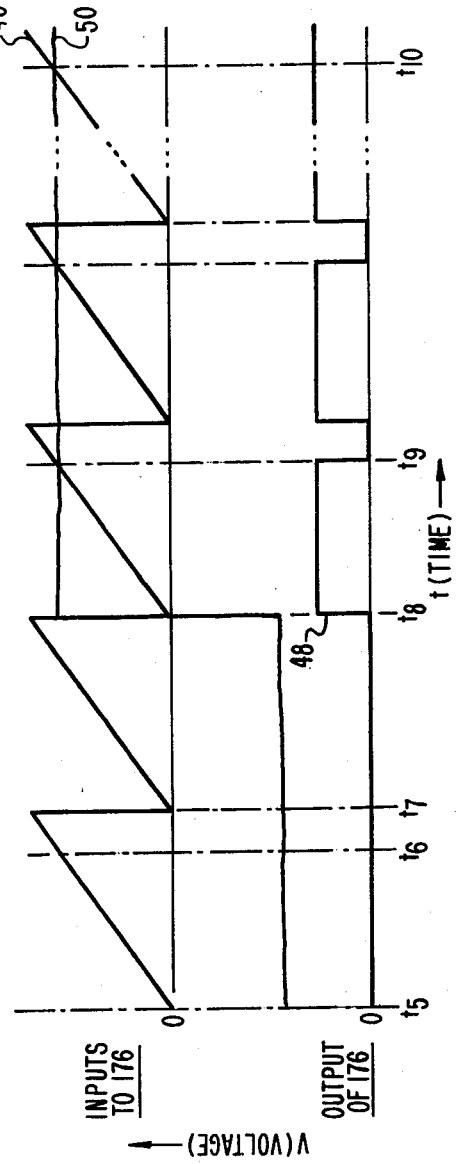

ELECTRICAL ENERGY MEASURING MULTIMETER

BACKGROUND OF THE INVENTION

1. Field of the Invention

This invention relates to electrical energy measuring circuits used to measure electrical energy consumption by computing the product, and the time integral of the product, of two parameters of an electrical energy quantity. More specifically, this invention relates to those electrical energy measuring circuits which utilize a mutual inductance current sensing transducer capable of sensing widely varying amplitudes of the current. The mutual inductance current sensing transducer is used to produce one of the parameters of the electrical energy quantity to be measured.

2. Description of the Prior Art

For measuring the electrical energy consumption of separate electrical energy users the electromechanical rotating disc-type of watthour meter continues to be used almost exclusively. This widespread use is justified because of the meter's high degree of accuracy and reliability during many years of service under widely varying ambient operating conditions. It is also justified because of the meter's low cost, and the ease with which it can be installed.

Solid state watthour meters are being investigated for the same reasons identified above. However, it is also expected that solid state watthour meters will be capable of performing additional functions, such as load control, measurement of various parameters of electrical energy consumption, time-of-day metering, and communicating with remote meter reading equipment. Accordingly, much investigation is being carried out in the area of solid state watthour meters.

One characteristic feature of solid state meters is the need for low level input signals. At typical customer locations line voltages of either 120 or 240 volts define the voltage component of the electrical energy quantity to be measured. Standard potential transformer arrangements can provide practical voltage sensing transducers. On the other hand, load currents which define the current component of the electrical energy quantity to be measured vary considerably. A substantially linear response is desired in the range from $\frac{1}{8}$ ampere to 200 amperes. Current transformers producing low level output signals from the aforementioned widely varying input signals are of substantial size and cost.

For the reasons cited above, it is desirable to provide current sensing transducers which are accurate, inexpensive, of a convenient size, and are capable of producing the low level signals required by AC electrical energy measuring circuits. A transducer meeting these requirements is disclosed in U.S. patent application Ser. No. 923,619, filed July 11, 1978, for a "Mutual Inductance Current Transducer For AC Electrical Energy Meters". This current sensing transducer provides an analog signal proportional to the time derivative of the line current. In light of this development, it has become advantageous to provide a solid state electrical energy measuring circuit capable of utilizing this time derivative type of input signal.

An invention which has recognized the advantages of using a solid state meter which can operate using a time derivative input signal is disclosed in U.S. patent application Ser. No. 923,530, filed July 11, 1978, and assigned to the assignee of this invention. An AC electrical energy measuring circuit is disclosed for converting an analog input signal, which is proportional to the time derivative of the current component, into a pulse width modulated signal (PWM signal). This PWM signal is then amplitude modulated by a signal proportional to the voltage component to produce a variable amplitude pulse width modulated signal having an average value equal to the voltage component times the current component.

Another example is U.S. patent application Ser. No. 919,874, filed June 26, 1978, and assigned to the assignee of this invention. An electrical energy meter is disclosed wherein the voltage component of an electrical energy quantity to be measured is converted by electrical circuit techniques to a signal proportional to the time integral of the voltage component. The time integral voltage signal is compared to incremental reference levels. Each instance that a referenced level is reached, the instantaneous magnitude of the current component is sampled and converted to digital signals. These digital signals are summed to produce an output signal corresponding to a measure of electrical energy in watt-hours.

The present invention is for a solid state multimeter which utilizes a time derivative input signal to compute the electrical energy consumption.

SUMMARY OF THE INVENTION

The present invention is a new and improved electrical energy multimeter for computing electrical energy consumption by multiplying two electrical parameters.

A mutual inductance current sensing transducer is used to develop a first analog input signal proportional to the time derivative of the current component of an AC electrical energy quantity to be measured. This first analog input signal is applied to a full wave rectifier. The rectified signal is then applied to a voltage to frequency converter which produces a train of pulse signals. The number of pulses produced during a half cycle of the first analog input signal is proportional to the peak value of the current component during that half cycle.

A voltage transformer is used to develop a second analog input signal proportional to the voltage component of an AC electrical energy quantity to be measured. This second analog input signal is sampled at predetermined times. More specifically, the second analog input signal is sampled at its peak values to produce a first analog output signal proportional to the peak values of the voltage component. The second analog input signal is also sampled when the first analog input signal is zero to produce a second analog output signal proportional to the peak value of the voltage component multiplied by the cosine of the phase angle between the voltage and current components.

The instantaneous values of the first analog output signal are compared to the instantaneous values of a reference signal to produce a first gate command signal. This first gate command signal is used to control the switch which selectively connects the voltage to frequency converter to a totalizer. The totalizer counts the pulses of the train of pulse signals and stores the total. This total is related to the time integral of the product of the first analog input signal and the first analog output signal, which is related to the peak value of the current component times the peak value of the voltage component, or volt-ampere-hours.

The instantaneous values of the second analog output signal are compared to the instantaneous values of a reference signal to produce a second gate command signal used to control a switch which selectively connects the voltage-to-frequency converter to a totalizer. The totalizer counts the pulses of the train of pulse signals and stores the total. This total is related to the time integral of the product of the first analog input signal and the second analog output signal, which is related to the peak value of the current times the peak value of the voltage times the cosine of the phase angle between the voltage and the current components, or watthours.

BRIEF DESCRIPTION OF THE DRAWINGS

FIG. 5 is a time graph showing the relationship between the input signals and the output signal of a second comparator; and FIG. 6 is a time graph showing the relationship between the input signals and the output signal of a third comparator.

DESCRIPTION OF THE PREFERRED EMBODIMENTS

Figure 1:
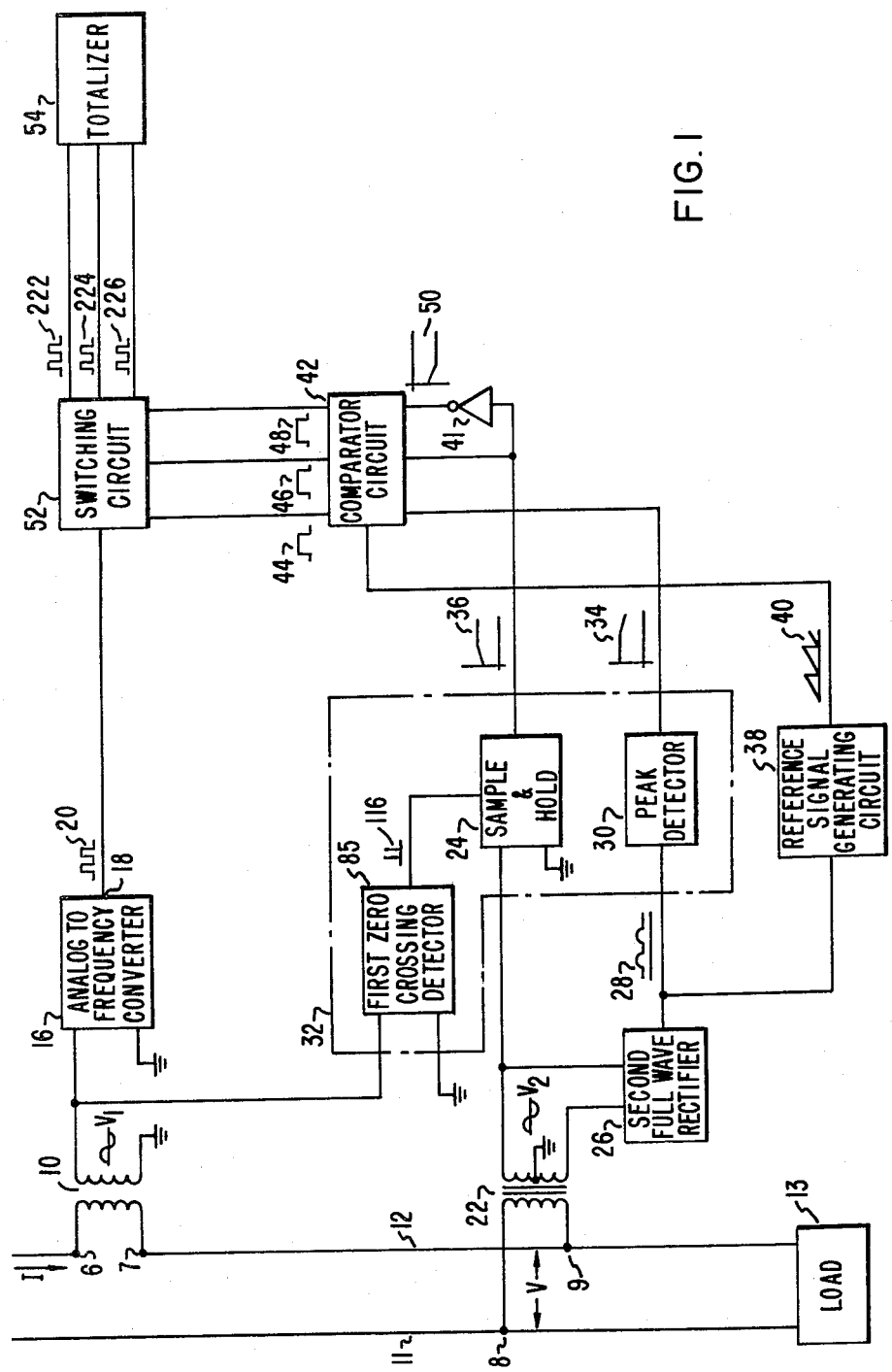
FIG. 1 is a schematic block diagram of an electrical energy multimeter constructed according to this invention.

Referring to FIG. 1, there is shown a schematic block diagram of a preferred embodiment of an electircal energy measuring multimeter constructed according to this invention. This invention is disclosed for measuring volt-ampere-hours and watthours, although it is to be understood that this invention may be practiced by measuring volt-ampere-hours or watthours.

Volt-ampere-hours may be computed according to the equation, $$E = \frac{1}{2} \int_{t_1}^{t_2} I_p V_p \, dt \quad (1)$$

where
E = energy measured in volt-ampere-hours
$I_p$ = peak current
$V_p$ = peak voltage
t = time Watthours may be computed according to the equation, $$E = \frac{1}{2} \int_{t_1}^{t_2} I_p V_p \cos \theta \, dt \quad (2)$$

where
E = energy measured in watthours
$I_p$ = peak current
$V_p$ = peak voltage
$\theta$ = phase angle between the voltage and current
t = time The implementation of these two equations will be illustrated in conjunction with the description of FIG. 1 hereinafter.

Describing now the block diagram shown in FIG. 1, a mutual inductance current transducer 10 having input terminals 6 and 7 is used to provide a first analog input signal $V_1$. The first analog input signal $V_1$ is proportional to the time derivative of the current I delivered through conductor 12 to a load 13 by an AC power source (not shown). The first analog input signal $V_1$ is input to an analog to frequency converter 16 which provides at its output 18 a train of pulse signals 20. The number of pulses in the train of pulse signals 20, counted over one cycle of the first input signal $V_1$, is proportional to the peak value of the current I during that cycle. In this manner the analog to frequency converter 16 provides a train of pulse signals 20 which is proportional to the peak value of the current $I_p$ which appears in both equation 1 and equation 2.

A potential transformer 22 having input terminals 8 and 9 is connected across the conductors 11 and 12 to provide a second analog input signal $V_2$ which is proportional to the voltage V delivered to the load 13 from an AC power source (not shown). The second analog input signal $V_2$ is input to a sample and hold circuit 24 and is also input to a second full wave rectifier 26. The second full wave rectifier 26 provides a second rectified output signal 28 which is a full wave rectification of the second analog input signal $V_2$.

The sample and hold circuit 24 together with a peak detector 30 are part of the sampling circuits 32 which sample the second analog input signal $V_2$ at predetermined times. Specifically, the peak detector 30 provides a first analog output signal 34 having a magnitude responsive to the magnitude of the first rectified output signal 28 at those times when the magnitude of the first rectified output signal 28 is at a peak value. The first analog output signal 34 is therefore proportional to the peak value $V_p$ of the second analog input signal $V_2$ which appears in equation 1.

The sample and hold circuit 24 provides a second analog output signal 36 having a magnitude responsive to the instantaneous magnitude of the second analog input signal $V_2$ at those times when the magnitude of the first analog input signal $V_1$ is zero. Since the first analog input signal $V_1$ has a value of zero when I is at a peak value, and since the instantaneous magnitude of the second analog input signal $V_2$ is proportional to the instantaneous magnitude of V, the magnitude of the second analog output signal 36 is proportional to the instantaneous magnitude of V when I is at a peak value.

The instantaneous value of the voltage component and the current component may be represented as follows:

$$v = V_p \cos(\omega t + \theta) \quad (3)$$

where
v = instantaneous value of the voltage
$V_p$ = peak voltage
$\omega$ = angular frequency
t = time
$\theta$ = phase angle between the voltage and the current components and $$i = I_p \cos(\omega t) \quad (4)$$

where
i=instantaneous value of the current
$I_p$=peak current.

The sample of the second analog input signal $V_2$ is taken when $$i = I_p.$$

Substituting this into equation 4 yields $$I_p = I_p \cos(\omega t)$$

or $$1 = \cos(\omega t).$$

If cos ($\omega t$) equals 1, then sin ($\omega t$) must equal 0. Using the trigonometric identity $$\cos(\omega t + \theta) = \cos(\omega t) \cdot \cos(\theta) - \sin(\omega t) \sin(\theta)$$

equation 3 may be expanded as follows:

$$v = V_p[\cos(\omega t) \cdot \cos(\theta) - \sin(\omega t) \sin(\theta)].$$

Substituting 1 for cos ($\omega t$) and 0 for sin ($\omega t$) yields:

$$v = V_p[1 \cdot \cos(\theta) - 0 \cdot \sin(\theta)]$$

or $$v = V_p \cos \theta$$

The second analog output signal 36 is therefore proportional to $V_p \cos \theta$ which appears in equation 2.

Continuing with the description of the block diagram shown in the FIG. 1, the second rectified output signal 28 is also input to a reference signal generating circuit 38 which provides a train of ramp signals 40. Since the frequency of the second rectified output signal 28 is essentially constant, the magnitude of the train of ramp signals increases substantially linearly with respect to time until the voltage is reset to zero. The period of the train of ramp signals 40 is much greater than the period of the line voltage. For these reasons, the train of ramp signals 40 is used as a periodic reference signal.

A comparator circuit 42 receives as input signals the first analog output signal 34, the second analog output signal 36, and the train of ramp signals 40. The instantaneous values of the first analog output signal 34 are compared to the instantaneous values of the train of ramp signals 40 to produce a first gate command signal 44. The instantaneous values of the second analog output signal 36 are compared to the instantaneous values of the train of ramp signals 40 to produce a second gate command signal 46. The second analog output signal 36 is also input to an inverter 41 which provides the inverse of the second analog output signal 50. A third gate command signal 48 is produced by comparing the instantaneous values of the inverse of the second analog output signal 50 to the instantaneous values of the train of ramp signals 40.

The gate command signals 44, 46 and 48 are applied to a switching circuit 52 which selectively connects the analog to frequency converter 16 to a totalizer 54. The totalizer accumulates the pulses of the train of pulse signals 20. Since the train of pulse signals 20 is proportional to $I_p$ and the first gate command signal 44 is proportional to $V_p$, one of the sums of pulse signals in the totalizer is related to the time integral of $I_p V_p$ or volt-ampere-hours. This is the implementation of equation 1. Similarly, the second and third gate command signals, 46 and 48, respectively, are proportional to $V_p \cos \theta$ so that the other sum of pulse signals in the totalizer is related to the time integral of $I_p V_p \cos \theta$ or watthours. This is the implementation of equation 2. Two gate command signals, 46 and 48, are needed to implement equation 2 since energy measured in watthours may be either positive or negative.

Figure 2:
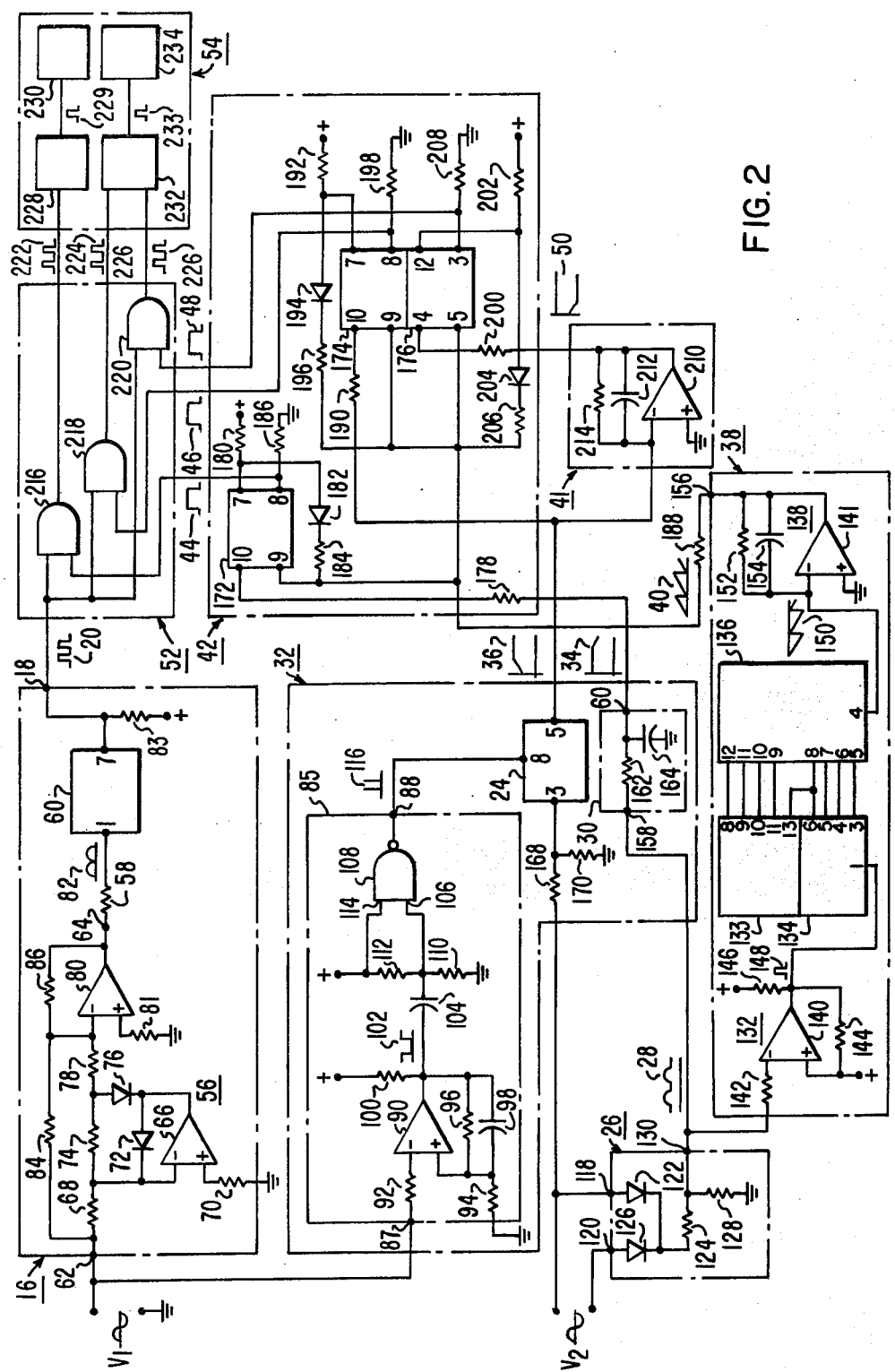
FIG. 2 is a schematic of an electrical energy multimeter constructed according to this invention.

Referring to FIG. 2, a more detailed functional description and a structural description will now be given. The first analog input signal $V_1$ is input to the analog to frequency converter 16. The analog to frequency converter 16 is composed of a first full wave rectifier 56 connected in series through a resistor 58 to a voltage to frequency converter 60. The first full wave rectifier 56 is a precision rectifier having an input terminal 62 and an output terminal 64. The inverting input terminal of an operational amplifier 66 is connected to the input terminal 62 through a resistor 68. The noninverting input terminal of the operational amplifier 66 is connected through a resistor 70 to ground. A diode 72 is connected across the operational amplifier 66 by connecting the cathode to the inverting input terminal and the anode to the output terminal. A resistor 74 and diode 76 are connected in parallel with the diode 72. The resistor 74 is connected in series with the diode 76, the cathode of the diode 76 being connected to the anode of the diode 72. The anode of the diode 76 is connected to the inverting input terminal of an operational amplifier 80 through a resistor 78. The noninverting input terminal of the operationl amplifier 80 is connected to ground through a resistor 81. The inverting input terminal of the operational amplifier 80 is also connected to the input terminal 62 through a resistor 84, and is connected to the output terminal 64 through a resistor 86. The output terminal 64 is connected to the output terminal of the operational amplifier 80. This structure forms a precision full wave rectifier 56 which is used to rectify the first analog input signal $V_1$ to produce a first rectified output signal 82.

This first rectified output signal 82 is the input to a voltage to frequency converter 60. A typical voltage to frequency converter is Burr-Brown's VFC32. Using this integrated circuit, the first rectified output signal 82 is applied to pin number 1. The voltage to frequency converter 60 produces at pin number 7, which is also the output 18 of the analog to frequency converter 16, the train of pulse signals 20 having a pulse repetition rate varying in response to the instantaneous magnitude of the analog input signal $V_1$. Pin number 7 is further connected to a positive voltage source through a resistor 83. The number of pulses in the train of pulse signals 20 counted over a cycle of the first analog input signal $V_1$ is a number proportional to the peak value of the first analog input signal $V_1$.

The first analog input signal $V_1$ is also input to a first zero crossing detector 85 having an input terminal 87 and an output terminal 88. The first zero crossing detector 85 is made up of an operational amplifier 90 having its inverting input terminal connected to the input terminal 87 through a resistor 92. The noninverting input terminal is connected to ground through a resistor 94. A resistor 96 in parallel with a capacitor 98 is connected between the noninverting input terminal and the output terminal of the operational amplifier 90. The output terminal of the operational amplifier 90 is also connected to a positive voltage source through a resistor 100.

Figure 3:
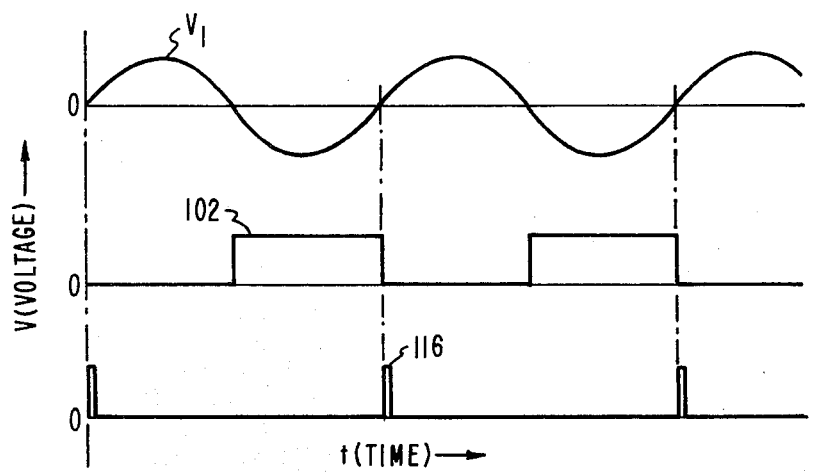
FIG. 3 is a time graph showing the relationship between the input and output signals of a zero crossing detector and the input and output signals of a NAND gate.

The operation of the first zero crossing detector 85 will be described in conjunction with FIG. 3. When the first analog input signal $V_1$ crosses zero going in a negative direction, the output signal 102 of the first zero crossing detector 85 changes from a low to a high state, as shown in FIG. 3. The output signal 102 is differentiated by a capacitor 104 and a resistor 110. This differentiated signal is then applied to the input terminal 106 of a NAND gate 108. The input terminal 106 is also connected to ground through the resistor 110 and is further connected to a positive voltage source through a resistor 112. The positive voltage source is connected to a second input terminal 114 of the NAND gate 108. The NAND gate 108 produces a sampling control signal 116 composed of a series of narrow pulses, each pulse being responsive to a trailing edge of the output signal 102 as shown in FIG. 3. A narrow pulse is produced each time the first analog input signal $V_1$ crosses zero going in a positive direction. The use of the sampling control signal 116 is described hereinbelow.

Returning to FIG. 2, the second analog input signal $V_2$ is connected to the input terminals 118 and 120 of the second full wave rectifier 26. The input terminal 118 is connected to a resistor 124 through a diode 122. The input terminal 120 is also connected to the resistor 124 through a diode 126, the cathodes of the diodes 122 and 126 being connected together. The resistor 124 is connected to the output terminal 130 of the second full wave rectifier 26 and is further connected to ground through a resistor 128. The second rectified output signal 28 is available at the output terminal 130 of the second full wave rectifier 26.

The second rectified output signal 28 is input to the reference generating circuit 38. The reference generating circuit 38 is composed of a second zero crossing detector 132, a counter 134, a digital to analog converter 136, and an inverter 138. At the input of the reference generating circuit 38 the second zero crossing detector 132 receives the second rectified output signal 28. The second rectified output signal 28 is applied to the inverting input terminal of an operational amplifier 140 through a resistor 142. The noninverting input terminal of the operational amplifier 140 is connected to a positive voltage source and is further connected through a resistor 144 to the output terminal of the operational amplifier 140. The output termianl of the operational amplifier 140 is further connected through a resistor 146 to a positive voltage source.

The second zero crossing detector 132 produces an output pulse 148 whenever the second rectified output signal 28 reaches a value of two volts, and is increasing in the positive direction. The operational amplifier 140 is biased to respond to this two volt level rather than the zero volt level because of the inherent characteristics of diodes 122 and 126. Because of the breakover voltages of the diodes 122 and 126, found in the second full wave rectifier 26, the second rectified output signal 28 is cut off at voltages lower than the breakover voltages of the diodes 122 and 126. The lower voltages which are cut off are of no consequence since the operational amplifier 140 is biased to respond to two volts, which is above the cut off voltages.

Returning now to the reference generating circuit 38 the output pulse 148 of the second zero crossing detector 132 is applied to a counter 134. A typical counter is a TTL part number SN54LS393, which is a dual four-bit binary counter. Using the counter, the output pulse 148 is applied to pin number 1. Pin number 6 is connected to pin number 13. The counter 134 provides an eight-bit number responsive to the accumulation of the pulses 148. The eight-bit number is available in parallel form at pin numbers 3, 4, 5, 6, 8, 9, 10, and 11. The counter 134 will count up to 256, which is 128 cycles of the second analog signal $V_2$, before returning to zero.

The eight-bit number that is the output of the counter 134 is input to a digital to analog converter 136. A typical part number for the digital to analog converter 136 is Motorola MC1508L8. Using this integrated circuit the eight-bit number is input to pins 5 through 12. An output signal 150 available at pin 4 is inversely proportional to the eight-bit number, i.e., when the eight-bit number is at a minimum the output signal 150 is at a maximum.

The signal 150 is input to an inverter 138. The inverter 138 is composed of an operational amplifier 141 which receives the signal 150 at its inverting input terminal. The noninverting input terminal is connected to ground. A resistor 152 in parallel with a capacitor 154 are connected between the inverting input terminal and the output terminal of the operational amplifier 141. The output terminal of the operational amplifier 141 is the output terminal 156 of the reference generating circuit 38. The signal available at the output terminal 156 of the reference generating circuit 38 is a train of ramp signals 40. Each ramp is composed of 256 discrete steps (see insert 1, FIG. 4) in response to 128 cycles of the second analog input signal $V_2$. The uses for the train of ramp signals 40 are discussed hereinbelow.

Returning to the second full wave rectifier 26, the second rectified output signal 28 is applied to the input terminal 158 of the peak detector 30. The input terminal 158 of the peak detector 30 is connected to the output terminal 160 through a resistor 162. The output terminal 160 is connected to ground through a capacitor 164. The capacitor 164 charges to a value equal to the peak value of the second rectified output signal 28. The first analog output signal 34 is proportional to the peak value of the second rectified output signal 28, and is available at the output terminal 160. The first analog output signal 34 has a small ripple voltage (see insert 2, FIG. 4) due to the charging and discharging of the capacitor 164. The use of the first analog output signal 34 is discussed hereinbelow.

The second analog input signal $V_2$ is input to a sample and hold circuit 24. A typical sample and hold circuit 24 is the DATEL Systems Inc., Model SHM-LM-2. Using this integrated circuit the second analog input signal $V_2$ is applied to pin number 3 through a resistor 168. Pin number 3 is also connected to ground through a resistor 170. The sampling control signal 116, discussed above, is applied to pin 8 which is the sample control. When a pulse is present in the sampling control signal 116, the sample and hold circuit 24 samples the second analog input signal $V_2$, and produces at pin number 5 the second analog output signal 36. The second analog output signal 36 is proportional to the instantaneous value of the second analog input signal $V_2$ at the time when the sample is taken. The second analog output signal 36 is composed of a series of discrete samples of the second analog input signal $V_2$ (see insert 3, FIG. 5). The uses for the second analog output signal 36 are described hereinbelow.

Figure 4:
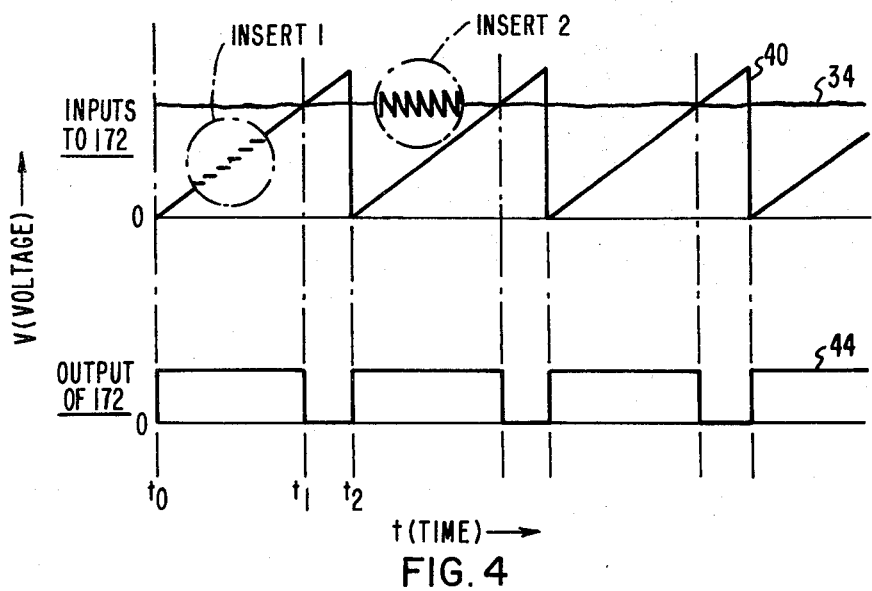
FIG. 4 is a time graph showing the relationship between the input signals and the output signal of a first comparator.

The comparator circuit 42 is composed of three individual comparators, a first comparator 172, a second comparator 174, and a third comparator 176. A typical dual voltage comparator is National Semiconductor's LM119D. Using this integrated circuit for the first comparator 172, the first analog output signal 34 is input to pin 10 through a resistor 178. Pin number 7 is connected to a positive voltage source through a resistor 180. Pin number 7 is also connected to pin number 9 through the series connection of a diode 182 and a resistor 184. Pin number 9 receives the train of pulse signals 40 through a resistor 188. The output signal of the first comparator 172 is the first gate command signal 44 and is available at pin number 8. Pin number 8 is further connected to ground through a resistor 186. Referring to FIG. 4, the first gate command signal 44 is a binary one when the train of ramp signals 40 is less than the first analog output signal 34 and is a binary zero when the train of ramp signals 40 is greater than the first analog output signal 34. The first gate command signal 44 is a binary one from time $t_0$ to time $t_1$, and a binary zero from time $t_1$ to time $t_2$. The use of the first gate command signal 44 is discussed in conjunction with the switching circuit 52 hereinbelow.

The second comparator 174 and third comparator 176 are both implemented using a National Semiconductor LM119 dual voltage comparator. The second comparator 174 receives the second analog output signal 36 at pin 10 through a resistor 190. Pin number 7 is connected to a positive voltage source through a resistor 192. Pin number 7 is also connected to pin number 9 through the series connection of a diode 194 and a resistor 196. Pin number 8 is connected to ground through a resistor 198. Pin number 9 receives the train of pulse signals 40. The output signal of the second comparator 174 is the second gate command signal 46 and is available at pin number 8. As shown in FIG. 5, the second gate command signal 46 is a binary one from time $t_5$ to time $t_6$, and a binary zero from time $t_6$ to time $t_7$. The second gate command signal 46 is a binary zero from time $t_8$ to time $t_{10}$. The use of the second gate command signal 46 is discussed in conjunction with the switching circuit hereinbelow.

When the second analog output signal 36 is negative (from time $t_8$ to time $t_{10}$ in FIGS. 5 and 6) the instantaneous values of the second analog output signal 36 will always be less than the instantaneous values of the train of ramp signals 40. In order to effect a comparison between the second analog output signal 36 and the train of ramp signals 40 the second analog output signal 36 is inverted 50 and compared to the train of ramp signals 40 in a third comparator 176.

The second analog output signal 36 is input to the inverting input terminal of an operational amplifier 210. The noninverting input terminal of the operational amplifier 210 is connected to ground. A capacitor 212 in parallel with a resistor 214 is connected between the inverting input terminal and the output terminal of the operational amplifier 210. This configuration makes up the inverter 41. The output signal 50 of the inverter 41 is the inverse of the second analog output signal 36. The signal 50 is input to pin 4 of the third comparator 176 through a resistor 200. Pin number 12 is connected to a positive voltage source through a resistor 202. Pin number 12 is also connected to pin number 5 through the series connection of a diode 204 and a resistor 206. Pin number 3 is connected to ground through a resistor 208. Pin number 5 receives the train of ramp signals 40. The output signal of the third comparator 176 is the third gate command signal 48 and is available at pin number 3. The third gate command signal 48 is a binary zero from time $t_5$ to time $t_8$, and a binary one from time $t_8$ to time $t_9$ as shown in FIG. 6. The use of the third gate command signal 48 is discussed in conjunction with the switching circuit 52 hereinafter.

The switching circuit 52 is composed of a first AND gate 216, a second AND gate 218, and a third AND gate 220. Each of the AND gates 216, 218 and 220, performs a switching function. The first AND gate 216 receives the train of pulse signals 20 and the first gate command signal 44. The output signal 222 of the first AND gate 216 is a binary one when both input signals are a binary one. Since the number of pulses (binary ones) in the train of pulse signals 20 in a given time is proportional to the peak value of the current component, and the time during which the first gate command signal 44 is a binary one is proportional to the peak value of the voltage component, the accumulation of the pulses comprising the output signal 222 is an indication of volt-ampere-hours.

The second AND gate 218 receives the train of pulse signals 20 and the second gate command signal 46. The output signal 224 of the AND gate 218 is a binary one when both input signals are a binary one. Since the time during which the second gate command signal 46 is a binary one is related to the peak value of the voltage component times the cosine of the phase angle between the voltage and current components (when the cosine of the phase angle is positive), the accumulation of the pulses comprising the output signal 224 is an indication of positive energy, or watthours.

The third AND gate 220 receives the train of pulse signals 20 and the third gate command signal 48. The output signal 226 of the AND gate 220 is a binary one when both input signals are a binary one. Since the time during which the third gate command signal 48 in a binary one is proportional to the peak value of the voltage component times the cosine of the phase angle between the voltage and current component (when the cosine of the phase angle is negative), the accumulation of the pulses comprising the output signal 226 is an indication of negative energy, or watthours.

Concluding the description of FIG. 2, the output signal 222 is input to a counter 228. The counter 228 accumulates the pulses comprising the output signal 222 and produces a first overflow signal 229. The first overflow signal 229 is used to increment a first mechanical register 230 which provides an indication of volt-ampere-hours. The output signals 224 and 226 are input to an up/down counter 232. The up/down counter 232 counts up in response to the pulses of output signal 224 and down in response to the pulses of the output signal 226. The up/down counter 232 produces a second overflow signal 233 which is used to increment a seond mechanical register 234. The second mechanical register 234 provides an indication of watthours. The counters 228 and 232 together with the mechanical registers 230 and 234 comprise the totalizer 54.

Briefly reviewing the function of the circuit shown in FIG. 2, the first analog input signal $V_1$ is rectified to provide a first rectified output signal 82. This first rectified output signal 82 is input to a voltage to frequency converter 60 which produces a train of pulse signals 20. The second analog input signal $V_2$ is rectified to produce a second rectified output signal 28. This second rectified output signal 28 is input to a reference signal generating circuit 38 which produces a train of pulse signals 40. The second rectified output signal 28 is also input to a peak detector 30 which produces the first analog output signal 34. The second analog input signal $V_2$ is also input to a sample and hold circuit 24, which samples the second analog input signal $V_2$ at those times when the first analog input signal $V_1$ is zero. This produces the second analog output signal 36.

The instantaneous values of the first analog output signal 34 are compared to the instantaneous values of the train of ramp signals 40. This comparison produces the first gate command signal 44. The instantaneous values of the second analog output signal 36 are compared to the instantaneous values of the train of ramp signals 40. This produces the second gate command signal 46. The instantaneous values of the inverse signal 50 of the second analog output signal 36 are compared to the instantaneous value of the train of ramp signals 40. This produces the third gate command signal 48. The gate command signals 44, 46, and 48 are used to control switches that selectively connect the train of ramp signals 20 to a totalizer 54.

What is claimed is:

1. An electrical energy measuring circuit multiplying a first and second analog input signals, comprising:
   first input means receiving said first analog input signal;
   second input means receiving said second analog input signal;
   analog to frequency converter means producing a train of pulse signals having a pulse repetition rate responsive to the peak values of said first analog input signal;
   means for sampling said second analog input signal at predetermined times, and having output means producing at least one analog output signal responsive to said second analog input signal;
   means producing a periodic reference signal;
   means for comparing the instantaneous values of said reference signal to the instantaneous values of said at least one analog output signal;
   totalizing means; and
   switching means selectively connecting said analog to frequency converter means to said totalizing means, said switching means responsive to said means for comparing such that the total of pulse signals stored in said totalizing means is related to the time integral of the product of said first and said second analog input signals.

2. The electrical energy measuring circuit of claim 1 wherein the analog to frequency converter means includes a first full wave rectifier producing a first rectified output signal in response to the first analog input signal, and includes a voltage to frequency converter producing the train of pulse signals in response to said first rectified output signal.

3. The electrical energy measuring circuit of claim 1 including a second full wave rectifier producing a second rectified output signal in response to the second analog input signal, and wherein the means for sampling includes a peak detector providing a first analog output signal responsive to the peak values of said second rectified output signal.

4. The electrical energy measuring circuit of claim 1 wherein the means for sampling includes a first zero crossing detector producing a sampling control signal in response to the first analog input signal, and includes a sample and hold circuit producing a second analog output signal responsive to both the second analog input signal and said sampling control signal.

5. The electrical energy measuring circuit of claim 1 including a second full wave rectifier producing a second rectified output signal in response to the second analog input signal, and wherein the means for sampling includes a peak detector providing a first analog output signal responsive to the peak values of said second rectified output signal, said means for sampling further includes a first zero crossing detector producing a sampling control signal in response to the first analog input signal, and includes a sample and hold circuit producing a second analog output signal responsive to both said second analog input signal and said sampling control signal.

6. The electrical energy measuring circuit of claim 1 including a second full wave rectifier producing a second rectified output signal in response to the second analog input signal and wherein the means producing the reference signal includes a counter producing a binary output signal and includes a zero crossing detector responsive to said second rectified signal for incrementing said counter, and further includes a digital to analog converter producing a train of ramp signals responsive to said binary output signal, said train of ramp signals is said periodic reference signal.

7. The electrical energy measuring circuit of claim 3 wherein the means for comparing includes a first comparator producing a first gate command signal responsive to the differences between the instantaneous values of the reference signal and the instantaneous values of the first analog output signal.

8. The electrical energy measuring circuit of claim 4 wherein the means for comparing includes a second comparator producing a second gate command signal responsive to the differences between the instantaneous values of the reference signal and the instantaneous values of the second analog output signal.

9. The electrical energy measuring circuit of claim 8 wherein the means for comparing further includes an inverter receiving the second analog output signal and producing the inverse of the second analog output signal, and includes a third comparator producing a third gate command signal responsive to the differences between the instantaneous values of the reference signal and the instantaneous values of said inverse of the second analog signal.

10. The electrical energy measuring circuit of claim 5 wherein the means for comparing includes a first comparator producing a first gate command signal responsive to the differences between the instantaneous values of the reference signal and the instantaneous values of the first analog output signal, and includes a second comparator producing a second gate command signal responsive to the differences between the instantaneous values of the reference signal and the instantaneous values of the second analog output signal.

11. The electrical energy measuring circuit of claim 10 wherein the means for comparing further includes an inverter receiving the second analog output signal and producing the inverse of the second analog output signal, and includes a third comparator producing a third gate command signal responsive to the differences between the instantaneous values of the reference signal and the instantaneous values of said inverse of the second analog signal.

12. The electrical energy measuring circuit of claim 7 wherein the switching means includes a first gate for selectively connecting the analog to frequency converter means to the totalizing means in response to the first gate command signal.

13. The electrical energy measuring circuit of claim 18 wherein the switching means includes a second gate for selectively connecting the analog to frequency converter means to the totalizing means in response to the second gate command signal.

14. The electrical energy measuring circuit of claim 9 wherein the switching means includes a second gate for selectively connecting the analog to frequency converter means to the totalizing means in response to the second gate command signal, and includes a third gate in parallel with the second gate for selectively connecting the analog to frequency converter means to the totalizing means in response to the third gate command signal.

15. The electrical energy measuring circuit of claim 10 wherein the switching means includes a first gate for selectively connecting the analog to frequency converter means to the totalizing means in response to the first gate command signal, and includes a second gate in parallel with the first gate for selectively connecting the analog to frequency converter means to the totalizing means in response to the second gate command signal.

16. The electrical energy measuring circuit of claim 11 wherein the switching means includes a first gate for selectively connecting the analog to frequency converter means to the totalizing means in response to the first gate command signal, and includes a second gate in parallel with the first gate for selectively connecting the analog to frequency converter means to the totalizing means in response to the second gate command signal, and further includes a third gate in parallel with the first and second gates for selectively connecting the analog to frequency converter means to the totalizing means in response to the third gate command signal.

17. An electrical energy measuring circuit, measuring volt-ampere-hours, responsive to a voltage and a current delivered to a load, including: first input means receiving a first analog input signal responsive to the time derivative of said current; second input means receiving a second analog input signal responsive to said voltage; analog to frequency converter means producing a train of pulse signals having a pulse repetition rate responsive to the peak values of said first analog input signal; means for sampling said second analog input signal at its peak values, and for producing a first analog output signal responsive to said peak values of said second analog input signal; means producing a train of ramp signals having an instantaneous value related to the frequency of said second analog input signal; means for comparing the instantaneous values of said first analog output signal to the instantaneous values of said train of ramp signals; totalizing means; and switching means for selectively connecting said analog to frequency converter means to said totalizing means, said switching means responsive to said means for comparing such that the total of pulse signals stored in said totalizing means is related to the time integral of the product of said voltage and said current.

18. An electrical energy measuring circuit, measuring watthours, responsive to a voltage and a current component of an AC energy delivered to a load, including: first input means receiving a first analog input signal responsive to the time derivative of said current component; second input means receiving a second analog input signal responsive to said voltage component; analog to frequency converter means producing a train of pulse signals having a pulse repetition rate responsive to the peak values of said first analog input signal; means for sampling said second analog input signal at the times when said first analog input signal has a value of zero, and for producing a second analog output signal responsive to the value of said second analog input signal when said first analog input signal has a value of zero; means producing a train of ramp signals having an instantaneous value related to the frequency of said second analog input signal; means for comparing the instantaneous values of said second analog output signal to the instantaneous values of said train of ramp signals; totalizing means; and switching means for selectively connecting said analog to frequency converter means to said totalizing means, said switching means responsive to said means for comparing such that the total of pulse signals stored in said totalizing means is related to the time integral of the produce of said voltage and current components.

* * * * *